United States Patent
Wu

(10) Patent No.: US 6,265,259 B1
(45) Date of Patent: *Jul. 24, 2001

(54) METHOD TO FABRICATE DEEP SUB-μM CMOSFETS

(75) Inventor: Shye-Lin Wu, Hsinchu (TW)

(73) Assignee: Texas Instruments-Acer Incorporated, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/351,876

(22) Filed: Jul. 13, 1999

Related U.S. Application Data

(63) Continuation-in-part of application No. 09/020,229, filed on Feb. 6, 1998, now Pat. No. 6,096,614.

(51) Int. Cl.[7] .................... H01L 21/8238; H01L 21/336
(52) U.S. Cl. .................... 438/232; 438/303; 257/413
(58) Field of Search .................... 438/232, 306, 438/303, 299, 482, 486, 565, 914; 257/413

(56) References Cited

U.S. PATENT DOCUMENTS

| | | | |
|---|---|---|---|
| 4,354,309 | * 10/1982 | Gardiner et al. | 438/564 |
| 5,670,397 | * 9/1997 | Chang et al. | 438/226 |
| 5,710,454 | * 1/1998 | Wu | 257/413 |
| 5,767,004 | * 6/1998 | Balasubramanian et al. | 438/592 |
| 5,817,547 | * 10/1998 | Eom | 438/142 |
| 5,891,794 | * 4/1999 | Ibok | 438/592 |
| 5,972,761 | * 10/1999 | Wu | 438/305 |
| 6,043,142 | * 3/2000 | Nakajima et al. | 438/585 |

* cited by examiner

*Primary Examiner*—Olik Chaudhuri
*Assistant Examiner*—William David Coleman

(57) ABSTRACT

The method of the present invention is to fabricate a CMOS device without boron penetration. Firstly, a gate oxide layer is formed on a semiconductor substrate. A first silicon layer is formed upon the gate oxide layer. Thereafter, a second silicon layer is stacked on the first silicon substrate, and N type dopant is in situ doped into the second silicon layer, and then a third silicon layer is stacked upon the second silicon layer. A gate structure is formed by patterning the stacked silicon layers, and source/drain structures with LDD regions are subsequently formed in the substrate by ion implantation processes. Finally, a thermal treatment is performed to form shallow source and drain junction in the substrate, thereby achieving the structure of the CMOS device. Meanwhile, the N type dopant is driven to the boundaries of stacked silicon layers of gate structure so as to act as diffusion barriers for suppressing boron penetration.

17 Claims, 3 Drawing Sheets

METHOD TO FABRICATE DEEP SUB-μM CMOSFETS

This application is a continuation-in-part of U.S. patent application Ser. No. 09/020,229, filed Feb. 6, 1998, now U.S. Pat. No. 6,096,614.

FIELD OF THE INVENTION

The present invention relates to a semiconductor device, and more specifically, to a method of fabricating a complementary metal oxide semiconductor field effect transistor (CMOSFET).

BACKGROUND OF THE INVENTION

Metal oxide semiconductor field effect transistors (MOSFETs) have been traditionally used and widely applied in semiconductor technologies. For deep sub-micron high performance MOS ULSI application, as suggested in the reference B. Davari, in IEDM Tech. Dig., p.555, 1996, the dual poly gate CMOS technology (p+ poly gate for PMOSFET and n+ poly gate for NMOSFET) is necessary. However, as mentioned in Y. Taur, et al., in IEDM Tech. Dig., p. 901, 1992, the effect of boron penetration through the thin gate oxide into silicon substrate will degrade the device performance. There are several methods to suppress the boron penetration effects, such as (1) $N_2O$ nitridation of thin gate oxide suggested in reference E. Hasegawa, et al., in IEDM Tech. Dig., p327, 1995, (2) the heavy nitrogen implantation (dosage>4E 15 cm-2) into poly-Si suggested in reference S Shimizu, et al., in IEDM Tech. Dig., p.67, 1994, and (3) the stacked-Si layer as gate material suggested in S. L. Wu, et al., in IEDM Tech. Dig., p329, 1993, etc.

Although the heavy nitrogen implantation into poly-Si layer could effectively suppress the boron penetration effects, the sheet resistance of poly gate will be largely increased with increasing the nitrogen dosage for both n+ and p+ poly gates, especially for the nitrogen dosage larger than 4E15 $cm^{-2}$. This is shown in the reference S. Shimizu, et al., J. Appl. Phys., vol. 35, p.802, 1996.

SUMMARY OF THE INVENTION

A first object of the present invention is to provide a method to fabricate dual gate CMOS devices without boron penetration.

A second object of the present invention is to provide a method to fabricate dual gate CMOS devices for suppressing boron penetration without serious side effects.

This invention discloses a method to fabricate dual gate CMOS devices with gate structures having diffusion barriers for suppressing boron penetration, a phenomenon that boron atoms doped in gate electrode penetrate into the gate oxide and substrate. Firstly, a gate oxide layer is formed on a semiconductor substrate. Thereafter, a first silicon layer, a second silicon layer, and a third silicon layer are successively stacked on the gate oxide layer, and N type dopant is in situ doped into the second silicon layer. After the three silicon layers are stacked, the gate structure is formed by etching the three stacked silicon layers, and then source/drain structures with LDD regions are subsequently formed in the substrate by ion implantation processes. Finally, a thermal treatment is performed to form shallow source and drain junction in the substrate, thereby achieving the structure of the CMOS device. Meanwhile, the N type dopant is driven to the boundaries of stacked silicon layers of gate structure so as to act as diffusion barriers for suppressing boron penetration.

Since the diffusion barriers of the invention are not formed by implanting nitrogen ions, the benefits could be summed up according to the following: (1) The device reliability could be improved by using the dual poly gate CMOS technology; (2) the boron penetration effects in p+ poly gate pMOSFETs could be fully suppressed by forming N type dopant diffusion barriers in the stacked silicon layers of the gate structure; and (3) the side effects of the heavy nitrogen ion implantation could be avoided.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the drawings. The purpose of the present invention is to provide a method for fabricating dual gate CMOS devices, whose gate electrodes are formed by stacking at least one silicon layer with boundaries piling up N type dopant for suppressing boron penetration. For clearly illustrating the present invention, a detailed embodiment will be described as follows.

Figure 1:
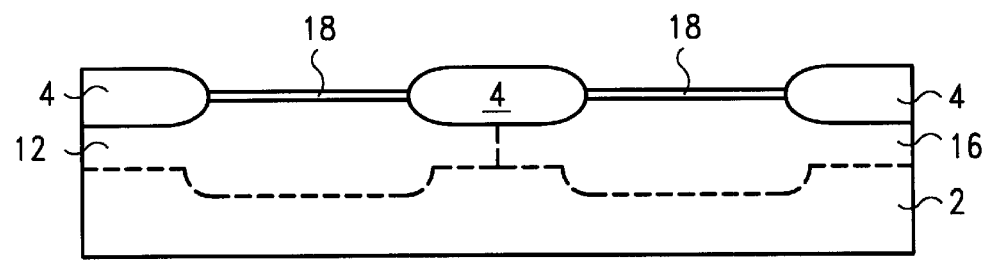
FIG. 1 is a cross-sectional view of a semiconductor substrate illustrating the step of growing a gate oxide layer on a semiconductor substrate according to the present invention.

Please refer to FIG. 1. In this preferred embodiment, a single crystal silicon substrate 2 with a <100> crystallographic orientation is provided, upon which field oxide (FOX) regions 4 are formed to define active areas amid them. However, as is well-known in the art, FOX regions 4 could also be alternated with shallow trenches for isolating the active areas. In this embodiment, FOX regions 4 are preferably formed through conventional processes in which a pad oxide layer and nitrided silicon layer are successively deposited over substrate 2, and then the nitrided silicon layer and pad oxide layer are patterned through a photolithography process to act as an oxidation mask for growing FOX regions 4 in a thermal oxidation process. Typically, FOX regions 4 would grow in a thickness from about 3000 to 8000 angstroms, depending on the case. Thereafter, for forming the structure of the CMOSFET, a twin well structure (include a P-well 12 and N-well 16) in the substrate 2 is preferably formed in substrate 2 by conventional methods, such as ion implantation and diffusion.

Still referring to FIG. 1, the nitrided silicon layer and pad oxide layer mentioned above are subsequently stripped. After the surface of substrate 2 is cleaned, a silicon dioxide layer is formed on the surface of substrate 2 for serving as gate oxide layer 18 by placing substrate 2 in an oxygen ambient at a temperature between about 700~1100 degrees centigrade, thereby growing gate oxide layer 18 in a thickness between about 15~250 angstroms. It is noted that the foregoing process is merely a widely used example, however other alternatives, such as Chemical Vapor Deposition method, could also be applied.

Figure 2:
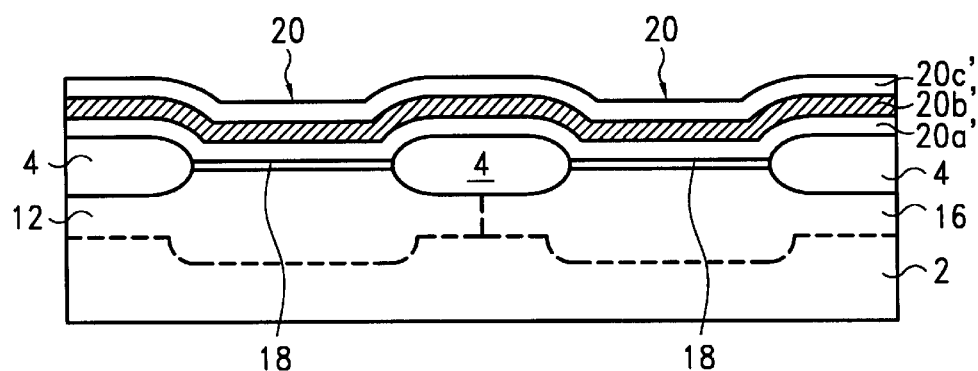
FIG. 2 is a cross-sectional view of the semiconductor substrate illustrating the step of stacking a first silicon layer, second silicon layer, in which N type dopant is in situ doped, and third silicon layer over the first silicon layer.

Referring to FIG. 2, a stacked silicon layer 20, in which each silicon layer 20a', 20b', and 20c' has a thickness between about 200–1000 angstroms, is formed upon the surface of substrate 2 by depositing first silicon 20a', second silicon layer 20b', and third silicon layer 20c' successively. In this preferred embodiment, first silicon layer 20a' is deposited upon the surface of substrate 2 by using a Chemical Vapor Deposition method employing silane as a silicon source reactant at a temperature about 450~620 centigrade degrees. Second silicon layer 20b' is then stacked over first silicon layer 20a' through a CVD process in the same chamber, which is used to form first silicon layer 20a', at the same manufacturing conditions besides introducing N type dopant gas into the chamber to in situ dope the dopant into second silicon layer 20b'. Third silicon layer 20c' is stacked over second silicon layer 20c' at the same manufacturing conditions with the formation of first silicon layer 20a'. In successive thermal treatment of the CMOSFET fabricating process, the N type dopant in second silicon layer 20b' would be driven to the boundaries between first silicon layer 20a' and second silicon layer 20b as well as second silicon layer 20b and third silicon layer 20c' to act as diffusion barriers for suppressing boron penetration, a phenomenon in which boron atoms doped in gate electrode penetrate into the gate oxide layer and substrate.

In the preferred embodiment, the N type dopant, such as phosphorus, arsenic, in second silicon layer 20b' is in a condition between about $1 \times 10^{17}$~$1 \times 10^{19}$ cm$^{-3}$, and the stacked silicon layer 20 could be selected from a material of polysilicon or amorphous-silicon. Furthermore, stacked silicon layer 20 is not limited to consist of three silicon layers. Therefore, more than three silicon layers could be successively stacked, and N type dopant is alternately doped into the stacked layers according to the present invention.

Figure 3:
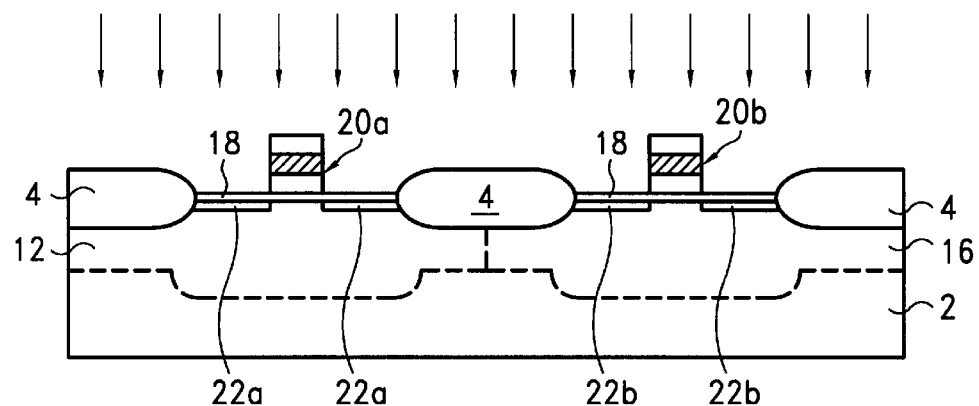
FIG. 3 is a cross-sectional view of the semiconductor substrate illustrating the step of defining a gate region and then performing a LDD implantation according to the present invention.

Turning to FIG. 3, stacked silicon layer 20 is etched back to form gate structures 20a and 20b on the top of P-well 12 and N-well 16, respectively. Then, a first lightly doped drain (LDD) implantation is carried out to form lightly doped source and drain regions 22a in P-well 12 by using a first photoresist layer covered over the N-well region as a mask. In this preferred embodiment, the dopant is B or BF$_2$, the dosage is about $10^{12}$ to $10^{14}$ ions/cm$^2$, and the implant energy is about 5 to 120 KeV. The first photoresist layer is then removed. A quite similar way is performed to form lightly doped source and drain regions 22b in the N-well 16 by using a second photoresist layer covered over the P-well as an implant mask. In this preferred embodiment, the dopant is P, As, or As/P, the dosage is about $10^{12}$ to $10^{14}$ ions/cm$^2$, and the implant energy is about 5 to 120 KeV. After forming the lightly doped source and drain regions 22b in the N-well, the second photoresist layer is removed.

Figure 4:
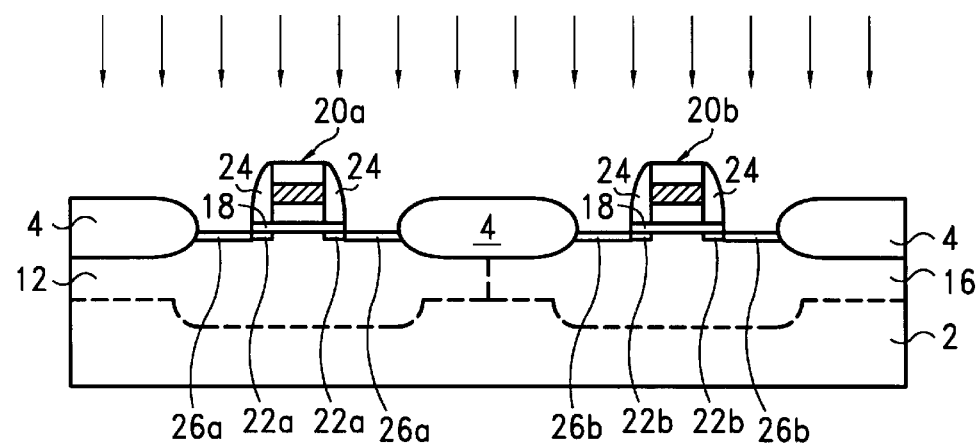
FIG. 4 is a cross-sectional view of the semiconductor substrate illustrating the step of forming dielectric spacers and then performing S/D/G implantation according to the present invention.

Referring to FIG. 4, a dielectric layer is deposited over gate structures 20a and 20b, FOX regions 4, and gate oxide layer 18. In the preferred embodiment, the dielectric layer is formed by a chemical vapor deposition process. Next, an anisotropic etching is performed on the dielectric layer to form dielectric side-wall spacers 24 on the side walls of each gate 20a, 20b. Following the formation of side wall spacers 24, a first S/D/G implant is performed to implant impurities into gate structure 20a atop the P-well 12, and into the P-well 12 to form source and drain regions 26a in P-well 12 by using a third photoresist layer covered over the N-well as an implant mask. In this preferred embodiment, the dopant is As or As/P, the dosage is from about 1014 to $10^{16}$ ions/cm$^2$, and the implant energy is about 0.5 to 80 KeV. The third photoresist layer is then removed. A quite similar process is carried out to form source and drain regions 26b in the N-well 16 by using a fourth photoresist layer covered over the P-well 12 as an implant mask. In this preferred embodiment, the dopant is B or BF$_2$, the dosage is from about $10^{14}$ to $10^{16}$ ions/cm$^2$, and the implant energy is about 0.5 to 80 KeV. After forming the source and drain regions 26b in the N-well 16, the fourth photoresist layer is removed.

Figure 5:
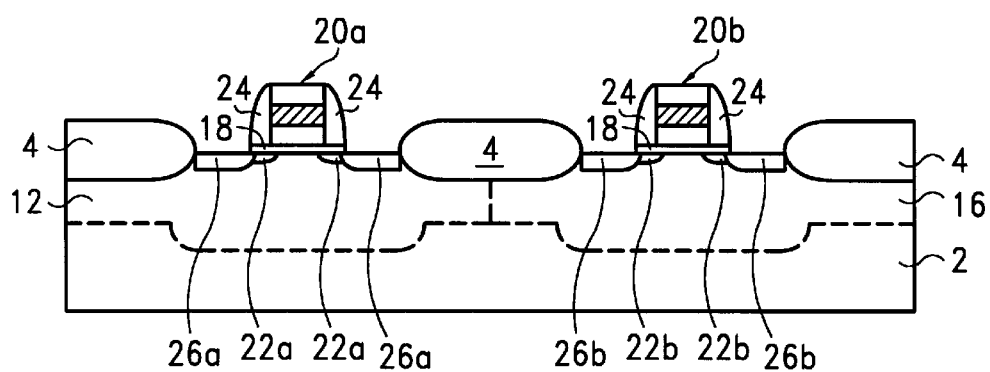
FIG. 5 is a cross-sectional view of the semiconductor substrate illustrating the step of performing a high temperature thermal treatment to form shallow junctions of source and drain structures according to the present invention.

Referring to FIG. 5, a high temperature thermal treatment is used to form shallow junctions 26a and 26b in P-well 12 and N-well 16, respectively. In this preferred embodiment, the high temperature thermal treatment is performed at a temperature from about 700 to 1050 degrees centigrade for 0.1–60 minutes. In this period, gate structures 20a and 20b, if consisting of stacked amorphous-silicon layers, would be transformed to the polycrystalline phase so as to form the gate electrodes of the CMOSFET. Meanwhile, the N type dopant in the gate structure is driven to the boundaries of the stacked silicon layers so as to act as diffusion barriers for suppressing boron penetration. As shown in the figure, a dual poly gate CMOSFET with a p+ polysilicon gate for PMOSFET and a n+ polysilicon gate for NMOSFET are hereby formed.

It is noticed that, in this preferred embodiment, the gate structure of CMOSFET having diffusion barriers, which are segregated in boundaries of the stacked silicon layers, could effectively prevent boron penetration, thereby improving the gate reliability. In addition, the gate structure, if converted from stacked amorphous-silicon layers, would provide the gate structure a lower gate resistance than that of the gate structure initially formed by stacked polysilicon layers. Furthermore, this embodiment discloses a method to suppress boron penetration without implanting nitrogen ions, therefore the gate resistance would not dramatically increase as a result of nitrogen ion implantation.

Summing up both the embodiments, the invention provides benefits of (1) the device reliability could be improved by using the dual poly gate CMOS technology; (2) the boron penetration effects in p+poly gate pMOSFETs could be fully suppressed by forming N type dopant diffusion barriers in the stacked silicon layers of gate structure; and (3) the side effects of the heavy nitrogen ion implantation could be avoided.

While the preferred embodiment of the invention has been illustrated and described, it will be appreciated that various changes can be made therein without departing from the spirit and scope of the invention. For example, this method that we proposed for fabricating CMOSFETs also can use in fabricating pMOFETS or nMOSFETs devices.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. A method for fabricating a P-type metal oxide semiconductor field effect transistor in a semiconductor substrate, said method comprising the steps of:

forming a gate oxide layer on said substrate;

forming a first silicon layer over said gate oxide layer;

forming a second silicon layer over said first silicon layer and in situ doping N type dopant therein;

forming a third silicon layer over said second silicon layer for serving as a stacked silicon layer in conjunction with said first and second silicon layer;

pattering said stacked silicon layer for forming a gate structure;

implanting P-type ions into said gate structure and said substrate adjacent to said gate structure to form source and drain structure; and thermally treating said gate structure and said substrate, thereby achieving shallow junctions of said source and drain structure in said substrate.

2. The method of claim 1, further comprising follow steps before forming said source and drain structure:

implanting ions into said substrate, thereby forming doped regions to serve as lightly doped source and drain of said transistor;

forming a dielectric layer over said gate structure; and etching said dielectric layer to form side-wall spacers encompassed aid gate structure.

3. The method of claim 1, wherein said first silicon layer, second silicon layer, and third silicon layer are from a material of polysilicon.

4. The method of claim 1, wherein said first silicon layer, second silicon layer, and third silicon layer are from a material of amorphous-silicon.

5. The method of claim 4, wherein said first silicon layer, second silicon layer, and third silicon layer of amorphous-silicon are converted into polysilicon during said thermally treating process.

6. The method of claim 1, wherein each silicon layer of said first silicon layer, second silicon layer, and third silicon layer has a thickness from about 200 to 1000 Angstroms.

7. The method of claim 1, wherein said first silicon layer and third silicon layers are formed through a Chemical Vapor Deposition employing silane as a silicon source material at a temperature between 450~620 centigrade degrees.

8. The method of claim 1, wherein said second silicon layer is formed through a Chemical Vapor Deposition method employing silane as a silicon source material at a temperature between 450~620 centigrade degrees in an ambient of said N type dopant gas, thereby in situ doping said N type dopant into said second silicon layer.

9. The method of claim 1, wherein said N type dopant comprises a phosphorus ion.

10. The method of claim 1, wherein said N type dopant comprises an arsenic ion.

11. The method of claim 1, wherein said N type dopant is doped in a condition between about $1\times10^{17}$~$1\times10^{19}$ cm$^{-3}$.

12. The method of claim 1, after said thermally treating step, wherein said N type dopant is segregated in boundaries of said first silicon layer and second silicon layer as well as said second silicon layer and third silicon layer, thereby serving as diffusion barriers for suppressing boron penetration.

13. A method for fabricating a metal oxide semiconductor field effect transistor in a semiconductor substrate, said method comprising the steps of:

forming a gate oxide layer on said substrate;

forming a first silicon layer over said gate oxide layer;

forming a second silicon layer over said first silicon layer and in situ doping N type dopant therein;

forming a third silicon layer over said second silicon layer for serving as a stacked silicon layer in conjunction with said first and second silicon layer;

pattering said stacked silicon layer for forming a gate structure;

implanting ions into said gate structure and said substrate, thereby forming doped regions to serve as lightly doped source and drain of said transistor;

forming a dielectric layer over said gate structure;

etching said dielectric layer to form side-wall spacers encompassed said gate structure;

second implanting ions into said gate structure and said substrate for forming source and drain structure adjacent to said gate structure in said substrate; and thermally treating said gate structure and said substrate, thereby driving said N type dopant to boundaries of said first silicon layer and said second silicon layer as well as said second silicon layer and said third silicon layer, thereby serving as diffusion barriers for suppressing boron penetration.

14. The method of claim 13, wherein said first silicon layer, second silicon layer, and third silicon layer are from a material of polysilicon.

15. The method of claim 13, wherein said first silicon layer, second silicon layer, and third silicon layer are from a material of amorphous-silicon.

16. The method of claim 15, wherein said first silicon layer, second silicon layer, and third silicon layer of amorphous-silicon are converted into polysilicon during said thermally treating process.

17. The method of claim 13, wherein said N type dopant is doped in a condition between about $1\times10^{17}$~$1\times10^{19}$ cm$^{-3}$.

* * * * *